United States Patent
Ohbayashi

(10) Patent No.: US 6,479,860 B2
(45) Date of Patent: Nov. 12, 2002

(54) SEMICONDUCTOR MEMORY DEVICE

(75) Inventor: Shigeki Ohbayashi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/835,569

(22) Filed: Apr. 17, 2001

(65) Prior Publication Data

US 2002/0074593 A1 Jun. 20, 2002

(30) Foreign Application Priority Data

Dec. 8, 2000 (JP) ........................................ 2000-374273

(51) Int. Cl.[7] .............................................. H01L 29/788
(52) U.S. Cl. ..................... 257/315; 257/303; 257/306; 257/903
(58) Field of Search ................................ 257/303, 306, 257/315, 368, 369, 370, 374, 397, 532, 534, 752, 903, 904; 365/154, 156, 189.11

(56) References Cited

U.S. PATENT DOCUMENTS

| | | | | |
|---|---|---|---|---|
| 4,849,801 A | * | 7/1989 | Honjyo et al. ................. | 257/51 |
| 5,057,893 A | * | 10/1991 | Sheng et al. ................... | 257/41 |
| 5,320,975 A | * | 6/1994 | Cederbaum et al. .......... | 438/44 |
| 5,352,916 A | * | 10/1994 | Kiyono et al. ............... | 257/903 |
| 5,406,107 A | * | 4/1995 | Yamaguchi ................... | 257/904 |
| 5,426,324 A | * | 6/1995 | Rajeevakumar ............ | 257/903 |
| 5,541,427 A | | 7/1996 | Chappell et al. | |
| 5,677,866 A | * | 10/1997 | Kinoshita ................... | 365/156 |
| 5,744,844 A | | 4/1998 | Higuchi | |
| 5,757,031 A | * | 5/1998 | Natsume ...................... | 257/903 |
| 5,831,899 A | * | 11/1998 | Wang et al. ................. | 257/903 |
| 5,850,090 A | * | 12/1998 | Oashi et al. ................. | 257/296 |
| 5,917,247 A | * | 6/1999 | Narita ......................... | 257/903 |
| 5,930,163 A | | 7/1999 | Hara et al. | |
| 6,015,990 A | * | 6/2000 | Hieda et al. ................. | 257/310 |
| 6,150,228 A | * | 11/2000 | Horiba ........................ | 438/384 |
| 6,211,004 B1 | * | 4/2001 | Ikeda et al. ................. | 257/904 |
| 6,271,063 B1 | * | 8/2001 | Chan et al. .................. | 257/903 |

FOREIGN PATENT DOCUMENTS

JP          57-012486          1/1982

OTHER PUBLICATIONS

"Process Technique of an LSI Including DRAMs," Trend of Technology, Sep. 1999, pp. 4–7.

* cited by examiner

Primary Examiner—David Nelms
Assistant Examiner—Andy Huynh
(74) Attorney, Agent, or Firm—McDermott, Will & Emery

(57) ABSTRACT

An SRAM memory cell relating to the present invention includes: first and second access MOS transistors; first and second driver MOS transistors; and first and second load MOS transistors. An insulating layer is formed on first and second gates respectively forming gates of the first and second driver MOS transistors and gates of the first and second load MOS transistors. On the insulating layer, formed are first and second conductive layers for forming capacitances between the first and second gates and the conductive layers. Furthermore, formed are a first local interconnect connecting the first gate and the second conductive layer therebetween and a second local interconnect connecting the second gate and the first conductive layer therebetween.

9 Claims, 17 Drawing Sheets

SEMICONDUCTOR MEMORY DEVICE

BACKGROUND OF THE INVENTION

1. Field of the Invention

The present invention relates to SRAM (Static Random Access Memory) provided with memory cells each including 6 MOS (Metal Oxide Semiconductor) transistors (hereinafter referred to as full-CMOS cell) and a fabrication process therefor, and more particularly, to a structure of a SRAM memory cell capable of improving soft error resistance and a fabrication process therefor.

2. Description of the Background Art

In company with development toward a lower operating voltage in SRAM devices, the main stream in 3 volt or less applications, a few years ago, had been SRAMs with memory cells including 4 MOS transistors of a high resistance load type or a TFT load type and two loads.

However, with further progress in reduced operating voltage such as 2.5 V, 1.8 V and to 1.5 V in recent years, a need for SRAM devices of a high resistance load type or a TFT load type have been on the decline because of its poor operating characteristics and instead, the dominant place has been being occupied by SRAMs having full-CMOS cells each including 6 MOS transistors.

Note that the term "full-CMOS cell" generally means a memory cell constructed of 2 bulk access n MOS transistors, 2 bulk driver n MOS transistors and 2 bulk load p MOS transistors.

A full-CMOS cell is superior to an SRAM cell of a high resistance load type or a TFT load type, both having storage nodes of a low charging ability, in regard to soft error resistance since in the full-CMOS cell, a storage node on the H (high) side of a bulk p MOS transistor can be charged. Note that soft errors are a phenomenon that α particle radiation emitted from radioactive impurities such as U or Th present in trace levels in common semiconductor packaging substances passes through a silicon substrate, and thereby, electron-hole pairs are generated in the bulk of the substrate and the information state of a cell is upset by noise of generated electron-hole pairs, leading to malfunction of the memory.

With progressive reduction in design rules, a cell size of SRAM memory has been smaller year by year and the trend toward lower operating voltage has also been enhanced. Along with such circumstances in change, a stored electric charge (voltage x capacitance) of a storage node of a SRAM memory cell has been on the decrease, which produces a soft error problem even in a full-CMOS cell.

For this reason, there has arisen a necessity to develop a method of protecting memory cells from soft errors even in a case of a full-CMOS cell, especially of a low operating voltage type adopting fine design rules of 0.18 $\mu$m or less.

An example of a full-CMOS cell to which a capacitance is added for reducing a soft error rate is disclosed in U.S. Pat. No. 5,541,427, wherein a capacitance is formed on an interconnect connecting storage nodes therebetween.

In order to obtain the above described capacitance, in U.S. Pat. No. 5,541,427 an insulating layer and a metal layer such as of tungsten are formed on an interconnect connecting storage nodes therebetween. The insulating layer and the metal layer are patterned using respective different masks. Therefore, a case arises where a capacitance decreases and cannot be ensured to a desired level, due to poor registration between masks in fabrication process for the insulating layer and the metal layer.

SUMMARY OF THE INVENTION

The present invention has been made in order to solve the above problem. It is accordingly an object of the present invention is to reduce a variation in capacitance added to a storage node of a semiconductor memory device.

A semiconductor memory device includes: memory cells each having first and second access MOS transistors, first and second driver MOS transistors and first and second load MOS transistors; a first gate forming a gate of the first driver MOS transistor and a gate of the first load transistor; a first conductive layer, formed on the first gate with a first insulating layer interposing therebetween, and for forming a capacitance between the first gate and the first conductive layer; a second gate forming a gate of the second driver MOS transistor and a gate of the second load MOS transistor; a second conductive layer, formed on the second gate with a second insulating layer interposing therebetween, and for forming a capacitance between the second gate and the second conductive layer; a first local interconnect connecting the first gate and the second conductive layer therebetween; and a second local interconnect connecting the second gate and the first conductive layer therebetween.

By forming the insulating layers and the conductive layers on the first and second gates in such a way, capacitors can be formed on the first and second gates. Herein, by connecting the first gate and the second conductive layer therebetween using the first local interconnect, and connecting the second gate and the first conductive layer therebetween using the second local interconnect, capacitances of the respective capacitors can be added to a storage node. Furthermore, with the capacitors formed on the first and second gates, respectively, a group of the first conductive layer, the first insulating layer and the first gate and a group of the second conductive layer, the second insulating layer and the second gate can be patterned using respective common masks. With the common masks employed, a prescribed overlapping area between layers can be ensured, whereby a variation in capacitance added to a storage node can be reduced.

A semiconductor memory device of the present invention includes: word lines; and a first well region of a first conductivity type, a second well region of a second conductivity type and a third well region of the first conductivity type, the three being arranged in each memory cell in an extending direction of each word line, wherein the first access MOS transistor and the first driver MOS transistor are formed in the first well, the first and second load MOS transistors are formed in the second well region and the second access MOS transistor and the second driver MOS transistor are formed in the third well region.

By adopting a layout as described above, a layout of an active layer and a gate can be made to assume a simple shape close to a straight line and a memory cell area can be reduced. Accordingly, a variation in capacitance added to a storage node can be decreased while down-sizing a memory cell area.

The first and second gates and the first and second conductive layers each preferably include a polysilicon layer. In this case, the first and second insulating layers are each formed between polysilicon layers.

By adopting such a construction and process, the fabrication process for DRAM (Dynamic Random Access Memory) which has been established based on proven historical records can be applied in a fabrication process for semiconductor memory devices of the present invention, which allows for easy formation of a large capacitance in a small area.

The first and second conductive layers each may be of a structure including a polysilicon layer and a silicide layer formed on the polysilicon layer. Alternatively, the first and second conductive layers each may be of a structure including a layer including metal. By adopting such structures, the first and second conductive layers can be of a low resistance.

The first and second access MOS transistors have respective gates formed by directly stacking an upper conductive layer corresponding to the first and second conductive layer on a lower conductive layer corresponding to the first and second gate.

With such a structure, it is prevented from occurring that the gates of the first and second access MOS transistors are added with respective unnecessary capacitances while lowering resistances of the gates of the first and second access MOS transistors. That is, there arises no necessity to adopt a special method by which the first and second transistors are operated with coupling capacitances.

A semiconductor memory device of the present invention includes: a memory cell region in which said memory cells are formed; and a peripheral circuit region in which a peripheral circuit performing control of operation of memory cells is formed, wherein MOS transistors are formed in the peripheral circuit region. Herein, gates of the MOS transistors in the peripheral circuit region each preferably have the same structure as each of the first and second access MOS transistors.

With the same gate structure adopted, the MOS transistors in the peripheral circuit region and the first and second access MOS transistors can perform ordinary operations.

The first gate has a first portion lacking the first conductive layer thereon and the first portion extends onto a drain of the second load MOS transistor; the second gate has a second portion lacking the second conductive layer thereon and the second portion extends onto a drain of the first load MOS transistor; the first local interconnect is electrically connected to the first portion and the second conductive layer through a first contact hole extending between the first portion and the second conductive layer; and the second local interconnect is electrically connected to the second portion and the first conductive layer through a second contact hole extending between the second portion and the first conductive layer.

As described above, the first and second conductive layers are selectively removed to form the first and second portions and contact sections are formed on the portions, whereby, the contact sections can be formed without increasing an area of a memory cell. Moreover, since the contact sections have only to be formed in the first and second conductive. layers, almost no need arises that an area of a memory cell is increased. Therefore, a capacitance can be added to a storage node without increasing an area of a memory cell.

It is preferable that the first contact hole reaches the second conductive layer locating between the second driver MOS transistor and the second load MOS transistor and the second contact hole reaches the first conductive layer locating between the first driver MOS transistor and the first load MOS transistor. With such a structure adopted, it is prevented from occurring that damage caused by formation of a contact hole affects transistors.

The semiconductor memory device is preferably formed on a semiconductor layer formed on a substrate with an insulating layer interposing therebetween. Like this structure, by adopting an SOI (Silicon On Insulator) structure, soft error resistance can be improved. Besides, a peripheral circuit can also be operated at high speed, and a leakage current can also be reduced.

A fabrication process for a semiconductor memory device relating to the present invention is for a semiconductor memory device including memory cells each having first and second access MOS transistors; first and second driver MOS transistors; and first and second load MOS transistors, and includes the steps of: forming a first conductive layer for forming gates of the first and second access MOS transistors, gates of the first and second driver MOS transistors and gates of the first and second load MOS transistors on a memory cell region with a first insulating layer interposing between the gates and the memory cell region; forming a second insulating layer on the first conductive layer; removing the second insulating layer located on gate forming regions of the first and second access MOS transistors; forming a second conductive layer so as to cover the first conductive layer and the second insulating layer; forming a first mask layer on the second conductive layer to pattern the second conductive layer using the first mask layer; and forming a second mask layer on the first mask layer to pattern the second insulating layer and the first conductive layer using the first and second mask layers, respectively.

As described above, by patterning the second conductive layer, the second insulating layer and the first conductive layer using the first and second mask layers formed on the second conductive layer, there can be formed not only the gates of the respective MOS transistors but also capacitors on the gates of the driver MOS transistor gates and on the gates of the load MOS transistors. In this case, since the second conductive layer is formed after removing the second insulating layer located on the gates of the access MOS transistors, the gates of the access MOS transistors can be formed with two conductive layers, stacked together, and electrically connected to each other, which exerts an effect as described above. Moreover, since a portion covered by the second mask can be sure to be left behind, a prescribed overlapping area can be ensured between the first and second conductive layers, and the second insulating layer. Thereby, a variation in capacitance added to a storage node can be reduced.

The foregoing and other objects, features, aspects and advantages of the present invention will becomes more apparent from the following detailed description of the present invention when taken in conjunction with the accompanying drawings.

DESCRIPTION OF THE PREFERRED EMBODIMENTS

Figure 1:
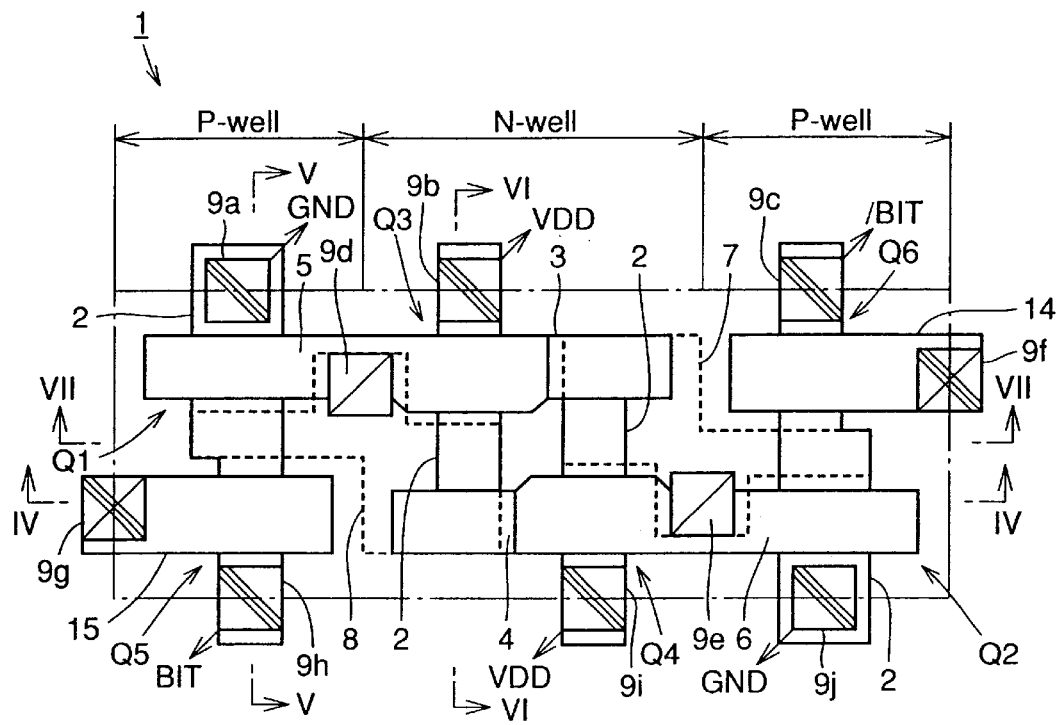
FIG. 1 is a plan view representing a layout of gate interconnects in a memory cell of a semiconductor memory device of the present invention.
Figure 2:
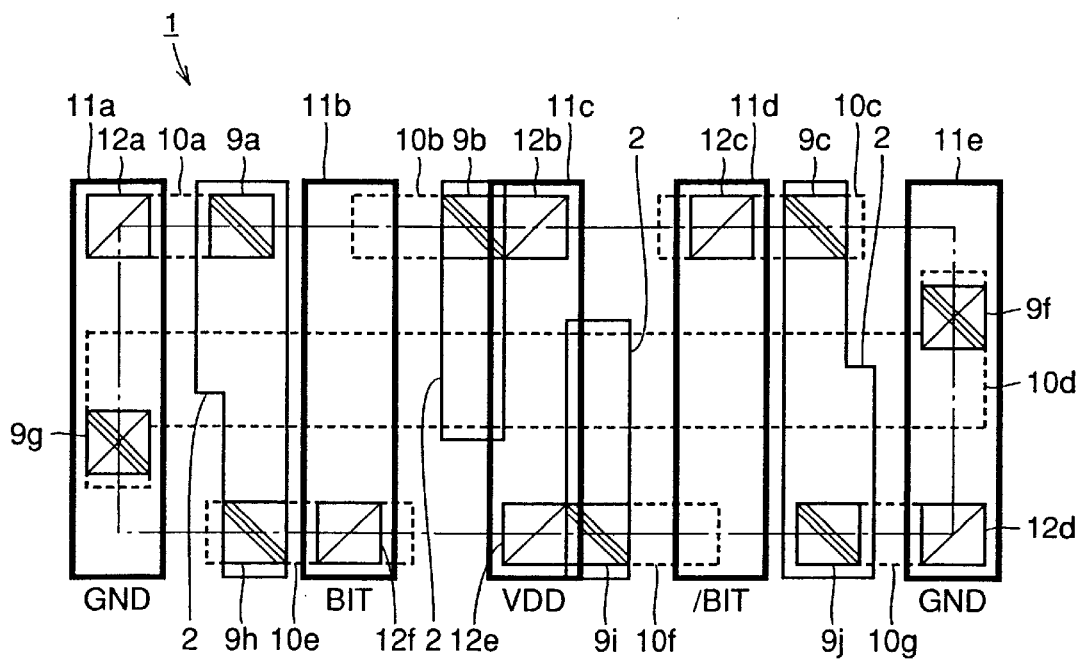
FIG. 2 is a plan view representing a layout of upper layer metal interconnects in a memory cell of a semiconductor memory device of the present invention.
Figure 3:
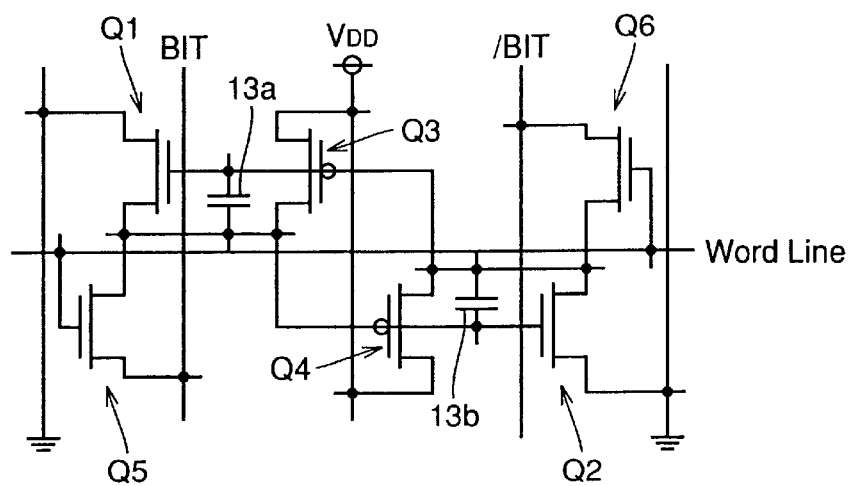
FIG. 3 is an diagram of an equivalent circuit of a memory cell of a semiconductor memory device of the present invention.

Description will be given of an embodiment of the present invention using FIGS. 1 to 35:

FIGS. 1 and 2 are plan views of a memory cell of SRAM (semiconductor memory device) in the embodiment. FIG. 3 is a diagram of an equivalent circuit of the SRAM cell in the embodiment. Note that in FIG. 1, shown is an layout of lower layer interconnects and in FIG. 2, shown is an layout of upper layer interconnects.

SRAM includes: a memory cell region in which memory cells 1 shown in FIG. 1 are formed; and a peripheral circuit region in which a peripheral circuit performing control of the memory cells 1 is formed.

A memory cell 1 has a full-CMOS cell structure, including first and second inverters and two access MOS transistors.

As shown in FIG. 3, the first inverter includes a first driver MOS transistor Q1 and a first load MOS transistor Q3 and the second inverter includes a second driver MOS transistor Q2 and a second load MOS transistor Q4.

The input and output of the first inverter are connected to the input and output, respectively, of the second inverter to form a flip flop, the source of the first access MOS transistor Q5 is connected to a first storage node of the flip flop and the source of the second access MOS transistor Q6 is connected to a second storage node of the flip flop.

As shown in FIG. 1, the memory cell 1 includes: a p well region, an n well region and a p well region arranged in a lateral direction (an extending direction of a word line) in this order. In the p well region in the left side, the first driver MOS transistor Q1 and the first access MOS transistor Q5 are formed; in the n well region located in the middle, the first and second load MOS transistors Q3 and Q4 are formed; and in the p well in the right side, the second driver MOS transistor Q2 and the second access MOS transistor Q6 are formed.

Furthermore, in the p well regions and the n well region, a plurality of active regions extending in a longitudinal direction are selectively formed and the first, second and third gates 3, 4, 14 and 15 are formed so as to extend-on the active region 2 in a lateral direction.

By adopting a layout as described above, the active regions 2 and the gates 3, 4, 14 and 15 combined can assume a simple shape similar to a straight line, thereby enabling an area of the memory cell 1 to decrease.

The first gate 3 serves as the gates of the first driver MOS transistor Q1 and the first load MOS transistor Q3 and the second gate 4 serves as the gates of the second driver MOS transistor Q2 and the second load MOS transistor Q4. The third gates 14 and 15 serve as the respective gates of the first and second access MOS transistors Q5 and Q6. The gates of the first and second access MOS transistors Q5 and Q6 are connected to a word line.

In the present invention, capacitors 13a and 13b are provided as shown in FIG. 3 to add a prescribed capacitance to a storage node.

To be concrete, as shown in FIG. 1, the first conductive layer 5 is formed on the first gate 3 with an insulating layer interposing therebetween, the second conductive layer 6 is formed on the second gate 4 with an insulating layer interposing therebetween, whereby the capacitors 13a and 13b are formed. In this memory cell 1, an input of the inverter is given to the first and second gates 3 and 4, and an output of the inverters is given to the first and second conductive layer.

With the capacitors 13a and 13b provided, a capacitance can be added to the storage node to improve soft error resistance.

Furthermore, by forming the capacitors 13a and 13b on the first and second gates 3 and 4, respectively, the first conductive layer 5, the insulating layer on the first gate 3 and the first gate 3 can be patterned with a common mask, and the second conductive layer 6, the insulating layer on the second gate 4 and the second gate 4 can be patterned with the common mask, whereby an overlapping area of the layers can be ensured, enabling a variation in capacitance added to the storage node to decrease.

Moreover, the first and second gates 3 and 4, and the first and second conductive layers 5 and 6, respectively, are forced to aligned with each other in connection with edges thereof, thereby enabling a margin between each of the layers and corresponding one of the contact sections to decrease. For this reason, a memory size can be reduced.

The first and second gates 3 and 4, and the first and second conductive layers 5 and 6 each preferably include a doped polysilicon layer. In this case, an insulating film same as the above described insulating layer is formed between polysilicon layers. With such a structure adopted, the fabrication process of DRAM which has been established based on proven historical records can be applied and a large capacitance can be formed in a small area with ease.

Note that the first and second conductive layers 5 and 6 may be fabricated in a layered structure composed of a polysilicon layer and a silicide layer, or alternatively, fabricated in a layered structure composed of metal layers or a combination of a metal layer and other conductive layers. Furthermore, the first and second gates 3 and 4 may each formed with a metal layer. With such layered structures of the above described materials adopted, the first and second gates 3 and 4, and the first and second conductive layers 5 and 6 each can be of a low resistance.

As shown in FIG. 1, the memory cell 1 includes: a first local interconnect 7 connecting the first gate 3, the prescribed active regions 2 and the second conductive layer 6 therebetween; and a second local interconnect 8 connecting the second gate 4, the prescribed active regions 2 and the first conductive layer 5.

The first gate 3 has a first portion on which the first conductive layer 5 lacks and the second gate 4 has a second portion on which the second conductive layer 6 lacks. The first portion extends onto the drain of the second load MOS transistor Q4 and the first portion is electrically connected to the drain of the second load MOS transistor Q4. The second portion extends onto the drain of the second load MOS transistor Q3 and the second portion is electrically connected to the drain of the second load MOS transistor Q3.

The first local interconnect 7 is electrically connected to the first portion through a contact hole formed on the first portion, electrically connected to the second conductive layer 6 through a contact hole 9e formed on the second conductive layer 6 and electrically connected to the drain of the second driver MOS transistor Q2.

The second local interconnect 8 is electrically connected to the second portion through a contact hole formed on the second portion, electrically connected to the first conductive layer 5 through a contact hole 9d formed on the first conductive layer and electrically connected to the drain of the first driver MOS transistor Q1.

Since the first and second conductive layers 5 and 6 are selectively etched off to remove respective portions on the drains thereof to correspondingly form the first and second portion and contact sections are formed on the first and second portions, respectively, the contact sections can be formed without increasing an area of the memory cell 1.

As shown in FIG. 1, the contact hole 9e is located on an element isolation region between the second driver MOS transistor Q2 and the load MOS transistor Q4 and the contact hole 9d is located in an element isolation region between the first driver MOS transistor Q1 and the first load MOS transistor Q3. With such a structure adopted, it can be prevented from occurring that damage generating when the contact sections are formed affects the transistors.

Preferably, the contact hole 9e is located in the middle between the second driver MOS transistor Q2 and the second load MOS transistor Q4 and the contact hole 9d is located in the middle between the first driver MOS transistor Q1 and the first load MOS transistor Q3.

With such a structure adopted, the contact hole 9d can be spaced apart from both of contact holes 9a and 9b and the contact hole 9e can be spaced apart from both of contact holes 9i and 9j. As a result, prevention can be assured of short-circuit between each of the first and second local interconnects 7 and 8 (a storage node), and a corresponding one of a $V_{DD}$ line and a GND line.

As shown in FIG. 2, first metal interconnects 10a to 10g are formed in an upper layer of the first and second conductive layer and second metal interconnects 11a to 11e are formed in an upper layer of the first metal interconnects 10a to 10g.

The first metal interconnect 10a is connected to the active region 2 through the contact hole 9a and connected to the second metal interconnect (GND line) 11a through a via hole 12a. The metal interconnect 10b is connected to the active region 2 through the contact hole 8b and connected to the second metal interconnect ($V_{DD}$ line) 11c through a via hole 12b.

The first metal interconnect 10c is connected to the active region 2 through the contact hole 9c and connected to the second metal interconnect (/BIT line) 11d through a via hole 12c. The first metal interconnect 10d is connected to a word line and connected to the third gates 14 and 15 through the contact holes 9f and 9g, respectively.

The first metal interconnect 10e is connected to the active region 2 through the contact hole 9h and connected to the second metal interconnect (BIT line ) 11b through a via hole 12f. The metal interconnect 10f is connected to the active region 2 through the contact hole 9i and connected to the second metal interconnect ($V_{DD}$ line) 11c through a via hole 12e. The first metal interconnect 10g is connected to the active region 2 through the contact hole 9j and connected to the second metal interconnect (GND line) 11e through a via hole 12d.

Figure 4:
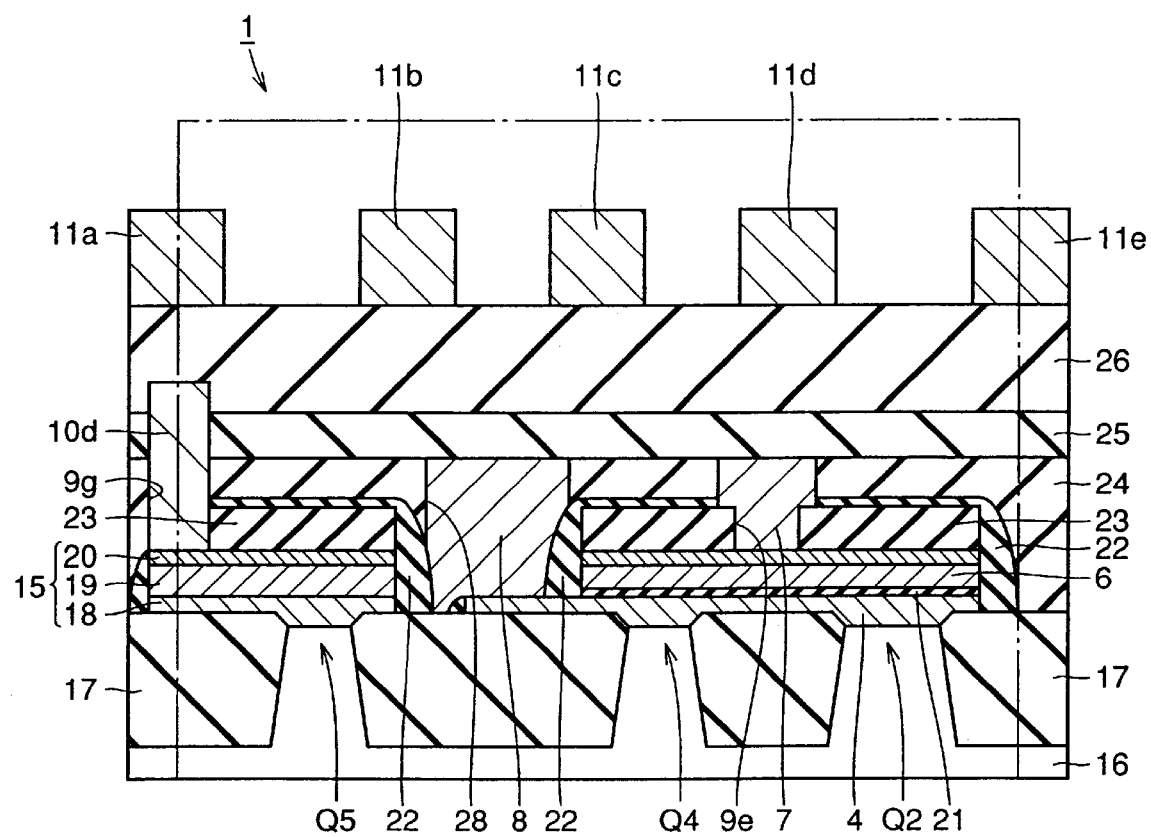
FIG. 4 is a sectional view taken on line IV—IV of FIG. 1.
Figure 5:
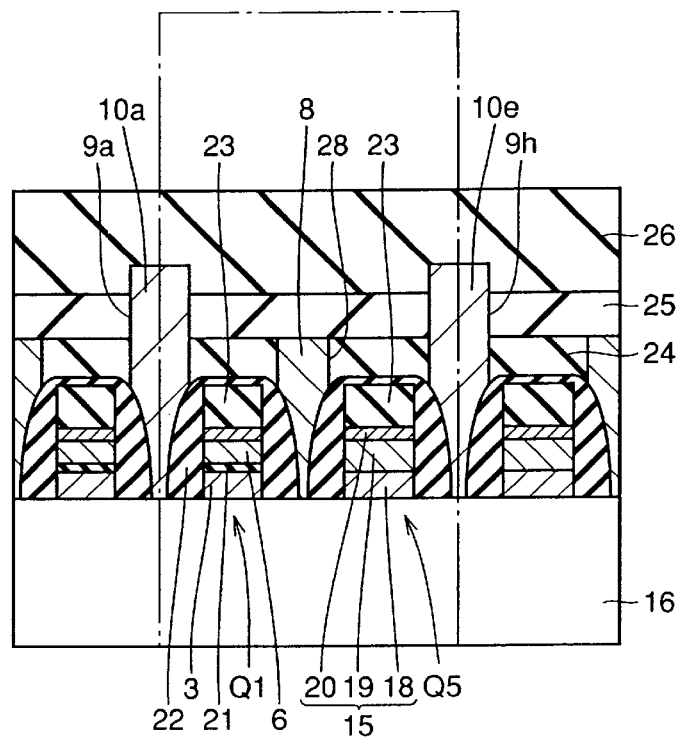
FIG. 5 is a sectional view taken on line V—V of FIG. 1.
Figure 6:
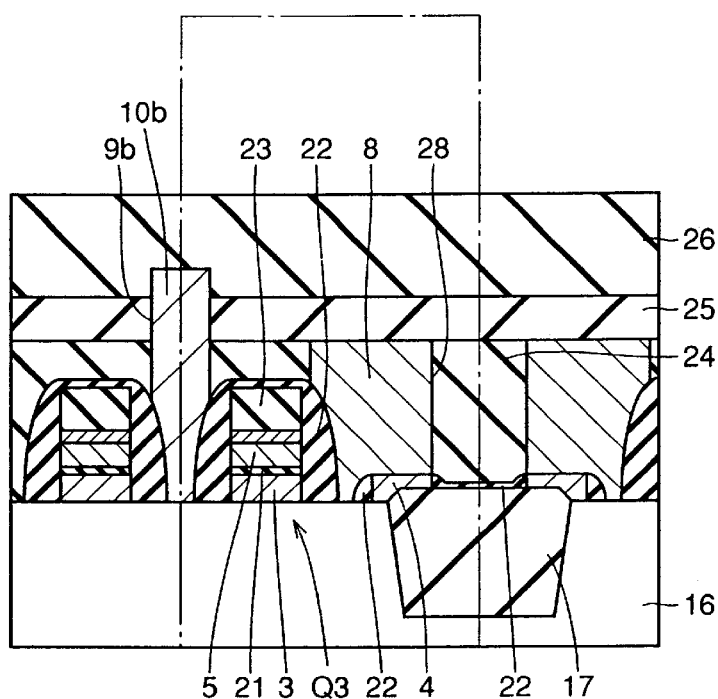
FIG. 6 is a sectional view taken on line VI—VI of FIG. 1.
Figure 7:
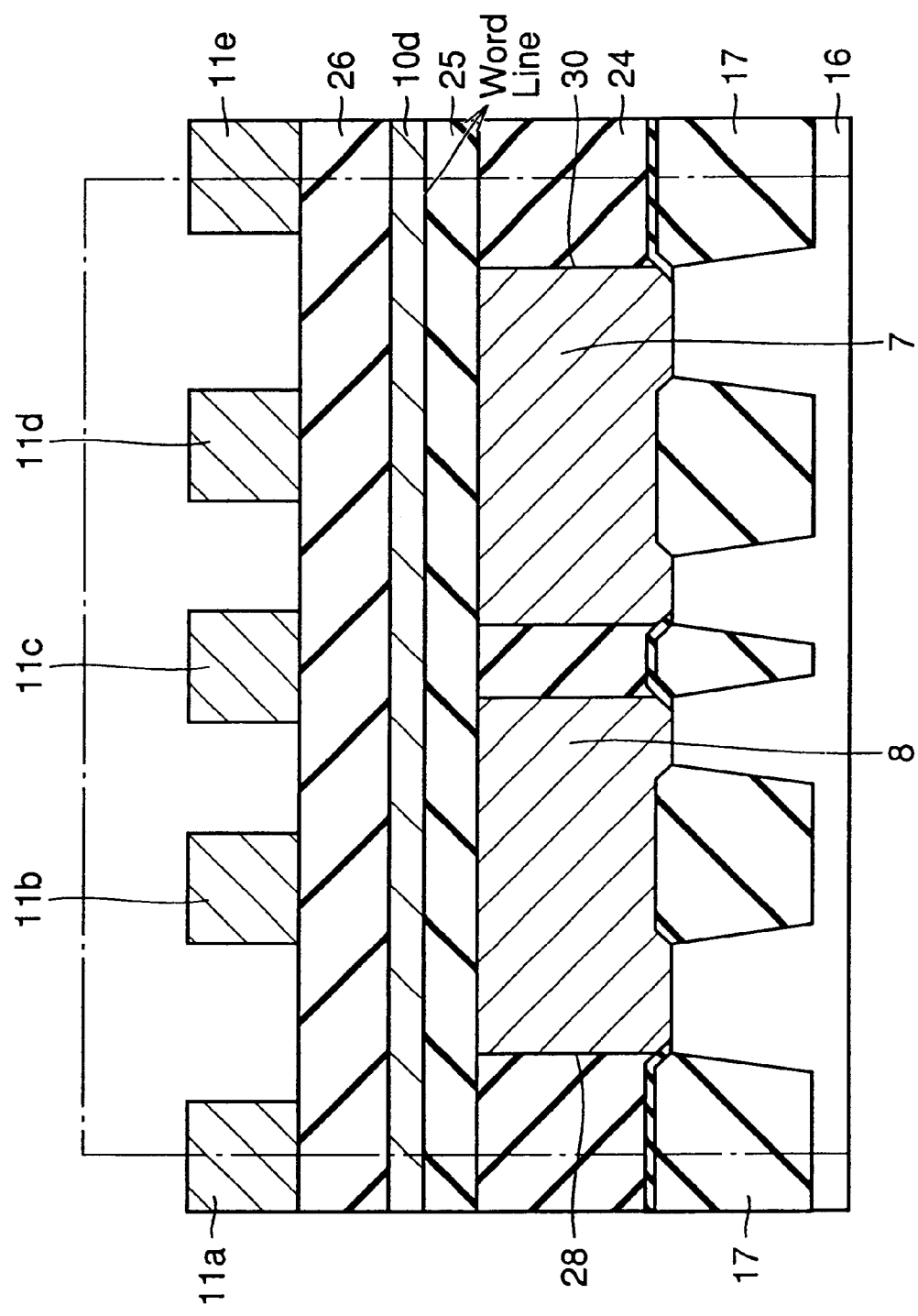
FIG. 7 is a sectional view taken on line VII—VII of FIG. 1.
Figure 8:
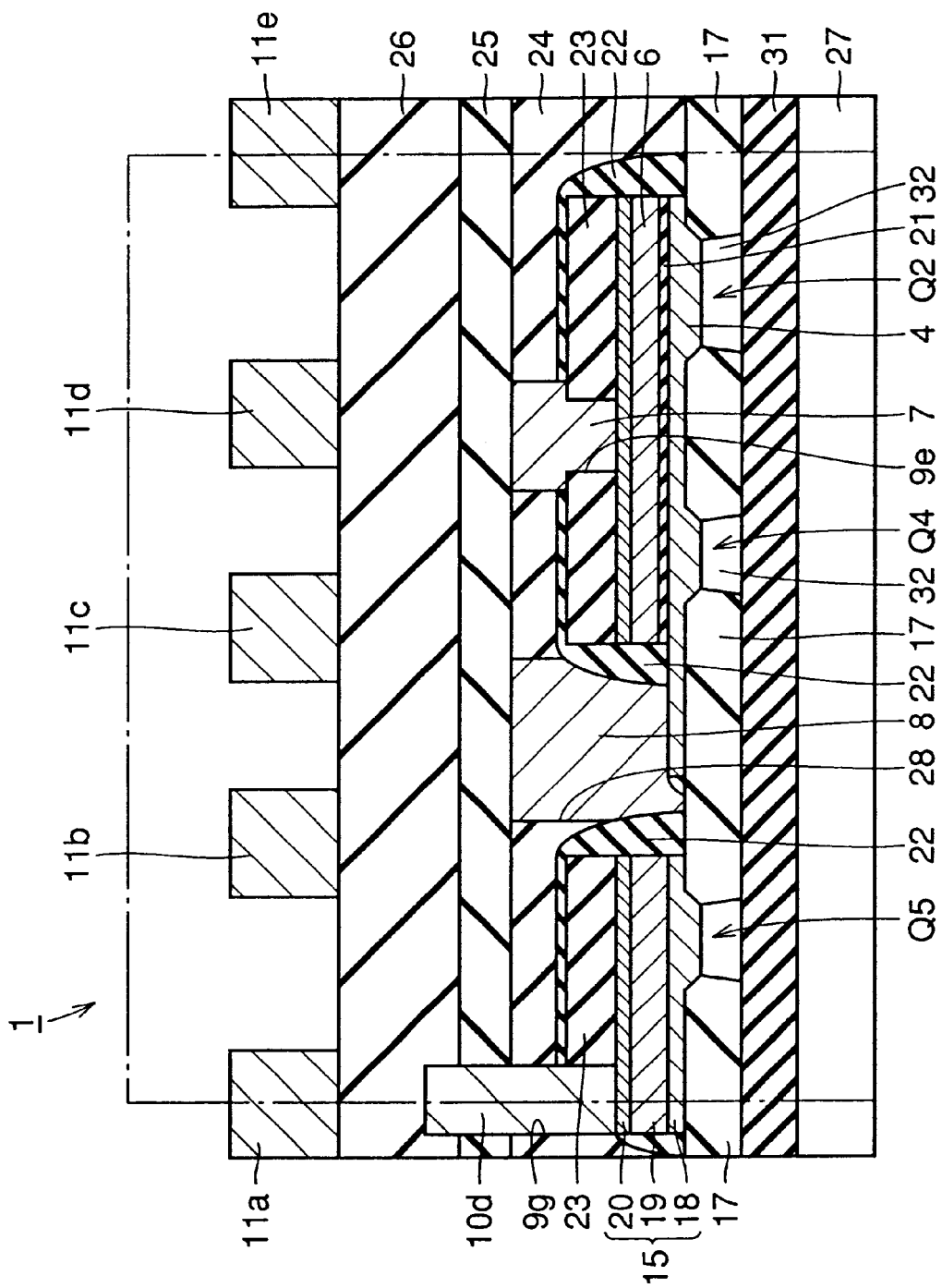
FIG. 8 is a sectional view of a memory cell when an SOI structure is adopted.

FIGS. 4 to 7 show sectional views of the memory cell 1 having the above described structure. FIG. 4 is a sectional view taken on line IV—IV of the memory cell 1 shown in FIGS. 1 and 2, FIG. 5 is a sectional view taken on line V—V of the memory cell 1 shown in FIGS. 1 and 2 , FIG. 6 is a sectional view taken on line VI—VI of the memory cell 1 shown in FIGS. 1 and 2, and FIG. 7 is a sectional view taken on line VII—VII of the memory cell 1 shown in FIGS. 1 and 2.

As shown in FIG. 4, an element isolation insulating layer 17 is selectively formed at a major surface of a semiconductor substrate 16 so as to define an active region. On the active region, formed are the second gate 4, the insulating layer 21 and the second conductive layer 6 with a gate insulating layer (not shown) interposing therebetween, whereby the above described capacitor 13b is formed. Note that the second conductive layer 6 has a layered structure composed of a polysilicon layer and a tungsten silicide layer in the first embodiment.

Furthermore, the third gate 15 is formed on a prescribed active region 2 with a gate insulating layer (not shown) interposing therebetween. The third gate 15 has a layered structure composed of a first polysilicon layer 18, a second polysilicon layer 19 and a tungsten silicide layer 20.

An insulating layer 23 is formed on the second conductive layer 6 and the third gate 15. A sidewall insulating layer 22 constituted of a substance capable of functioning as an etching stopper (for example silicon nitride layer) is formed on a sidewall of the-insulating layer 23, on a sidewall of the second conductive layer 6 and on a sidewall of the third gate 15.

An interlayer insulating layer 24 is formed so as to cover the sidewall insulating layer 22 and the insulating layer 23, and contact holes 28 and 9e penetrating the interlayer insulating layer 24 are formed therein. A second local interconnect 8 is formed in the contact hole 28 and a first local interconnect 7 is formed in the contact hole 9e. Here, electrical insulation is maintained between the second local interconnect 8 and the second conductive layer 6 by the sidewall insulating layer 22.

An interlayer insulating layer 25 is formed so as to cover the first and second local interconnects 7 and 8 and the contact hole 9g is formed so as to penetrate the interlayer insulating layers 24 and 25, and the insulating layer 23. The first metal interconnect 10d is formed in the contact hole 9g.

An interlayer insulating layer 26 is formed so as to cover the first metal interconnect 10d and the second metal interconnects 11a to 11e are formed on the interlayer insulating layer 26. An interlayer insulating layer (not shown) is further formed so as to cover the second metal interconnects 11a to 11e, a via hole (not shown) is formed in the interlayer insulating layer and third metal interconnects (not shown) are still further formed on the interlayer insulating layer.

As shown in FIG. 5, the third gate serving as the gate of the first access MOS transistor Q5 has a layered structure composed of the second polysilicon layer 19 and the tungsten silicide layer 20 stacked directly on the first polysilicon layer 18.

With such a structure adopted, the gate of the first access MOS transistor Q5 can be rendered to be of low resistance. Furthermore, since no insulating layer is provided between the polysilicon layer 18 and the second polysilicon layer 19, it can be prevented that unnecessary capacitance is added to the gate and thereby, an ordinary operation can be performed in the first access MOS transistor Q5. That is, there arises no necessity to adopt a special method by which the first access MOS transistor is operated with coupling capacitance.

In addition, with the gate of the first access MOS transistor Q5 of the above described structure, a self-aligned contact structure can be adopted between adjacent transistors, as shown in FIG. 5. Thereby, it is unnecessary to broaden a space between the transistors for formation of a contact section, thus enabling suppression of increase in cell size.

Note that since the second access MOS transistor Q6 has a similar structure to the first access MOS transistor Q5, a similar effect can be attained.

Figure 9:
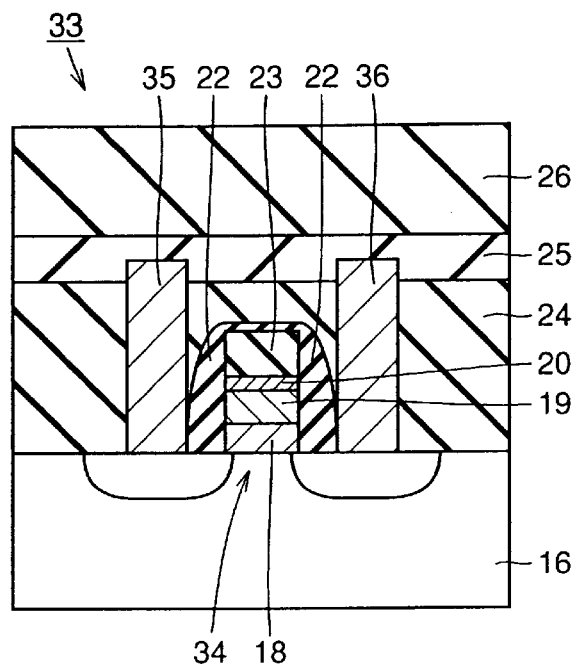
FIG. 9 is a sectional view representing an example structure of a MOS transistor formed in a peripheral circuit region.

Furthermore, as shown in FIG. 9, the gate of a MOS transistor 34 formed in a peripheral circuit region 33 has the same structure as the gates of the first and second access MOS transistors Q5 and Q6. Thereby, the MOS transistor 34 and the first and second access MOS transistors Q5 and Q6 can all operate ordinary operations.

The MOS transistor 34 in the peripheral circuit region 33, as shown in FIG. 9, has a pair of impurity diffusion layers serving as a source and drain, respectively, and a gate of a layered structure composed of the first and second polysilicon layers 18 and 19, and the tungsten silicide layer 20. To the pair of impurity diffusion layers, interconnect layers 35 and 36 are connected.

As shown in FIG. 7, the first metal interconnect 10d connected to a word line is formed on the interlayer insulating layer 25 and the first metal interconnect 10d extends in a lateral direction, which is a length direction of the memory cell 1.

While in the above described embodiment, description is given of a case where a SRAM cell is formed on a semiconductor substrate 16, the SRAM cell may be formed on a semiconductor layer 32 formed on a substrate 27 with an insulating layer 31 interposing therebetween. With an SOI structure adopted in such a way, soft error resistance can be further improved. Moreover, a peripheral circuit can also be operated at high speed and a leakage current can also be reduced.

Next, description will be given of a fabrication process for a memory cell 1 of SRAM relating to the present invention using FIGS. 10 to 35.

FIGS. 10 to 18 show sectional views taken on line IV—IV of the memory cell 1 shown in FIGS. 1 and 2 in respective steps, FIGS. 19 to 26 show sectional views taken on line V—V of the memory cell 1 shown in FIGS. 1 and 2 in respective steps and FIGS. 27 to 35 show sectional views taken on line VI—VI of the memory cell 1 shown in FIGS. 1 and 2 in respective steps.

Note that while in the following description, description will be given of a case where the memory cell 1 is formed on a semiconductor substrate, this can apply to a case where an SOI structure is adopted as well. It is also noted that an impurity profile within the semiconductor substrate is not shown for the sake of convenience in presentation.

Figure 10:
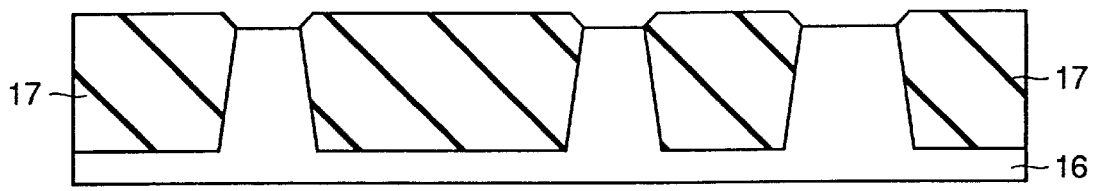
FIGS. 10 to 18 are sectional views representing a first step to a ninth step of a fabrication process for the semiconductor memory device shown in FIG. 1, corresponding to the sectional view of FIG. 4.
Figure 27:
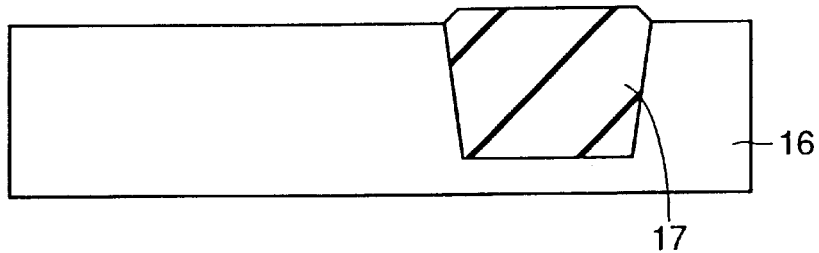
FIGS. 27 to 35 are sectional views representing the first step to the ninth step of a fabrication process for the semiconductor memory device shown in FIG. 1, corresponding to the sectional view of FIG. 6.

As shown in FIGS. 10 and 27, element isolation layers 17 are selectively formed at a major surface of the semiconductor substrate 16 located in a memory cell region. The element isolation layers 17 can be produced, for example, by thermally oxidizing the major surface of the semiconductor substrate 16 in a selective manner. Thereafter, impurities are introduced into the semiconductor substrate 16 to form wells (not shown).

Figure 11:
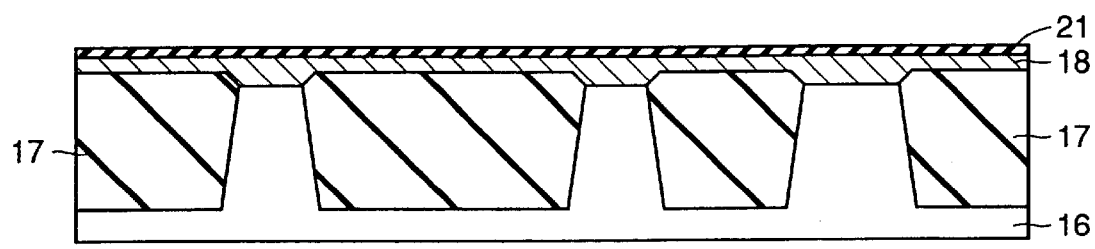
Figure 19:
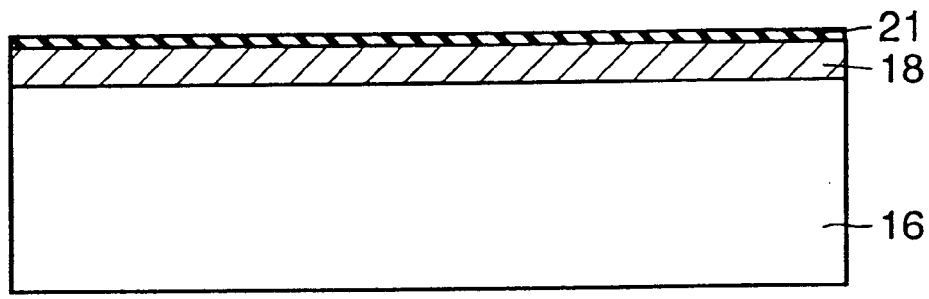
FIGS. 19 to 26 are sectional views representing the second step to the ninth step of a fabrication process for the semiconductor memory device shown in FIG. 1, corresponding to the sectional view of FIG. 5.
Figure 28:
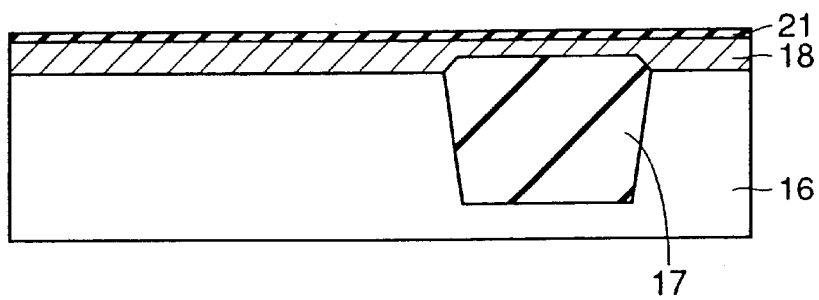

Next, a gate insulating layer (not shown) is formed by means of a CVD (Chemical Vapor Deposition) method or the like method and thereafter, as shown in FIGS. 11, 19 and 28, the first polysilicon layer 18 and the insulating layer 21 are deposited by means of a CVD method or the like method. An impurity is preferably doped in the polysilicon layer 18. As the impurity layer 21, there can be named an ONO layer obtained by stacking a silicon oxide layer, a silicon nitride layer and a silicon oxide layer or the like layer.

Then, on the insulating layer 21, formed is a mask layer (not shown) covering a region other than a region for forming the third gate (the gate of an access MOS transistor) and the insulating layer 21 is selectively etched using the mask layer. By doing so, the insulating layer 21 located on the third gate forming region is removed as shown in FIGS. 12 and 20.

Figure 12:
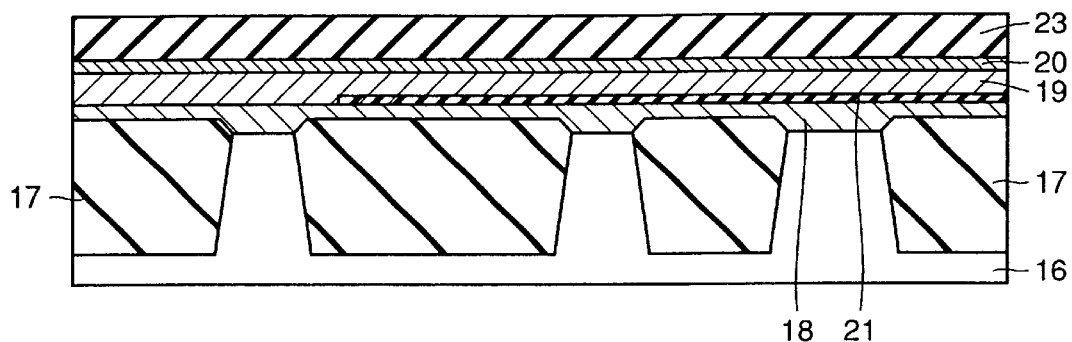
Figure 20:
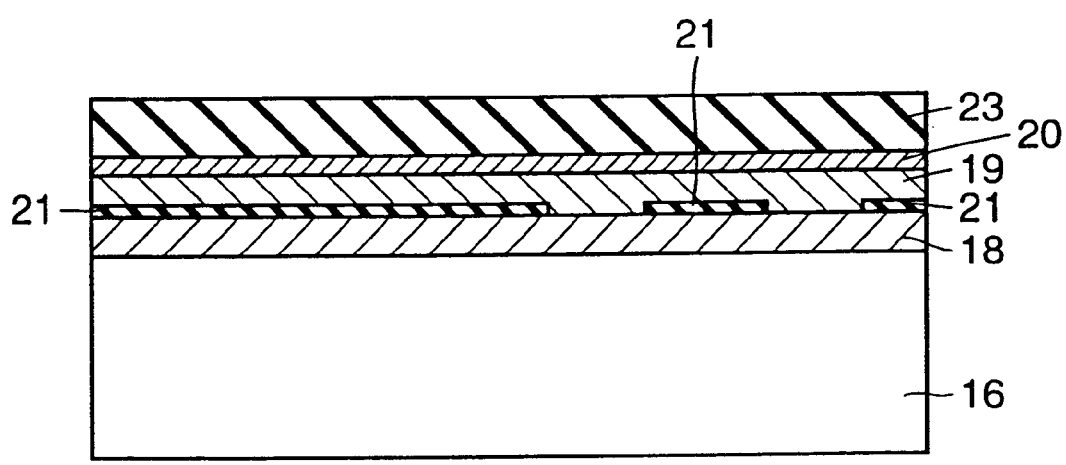
Figure 29:
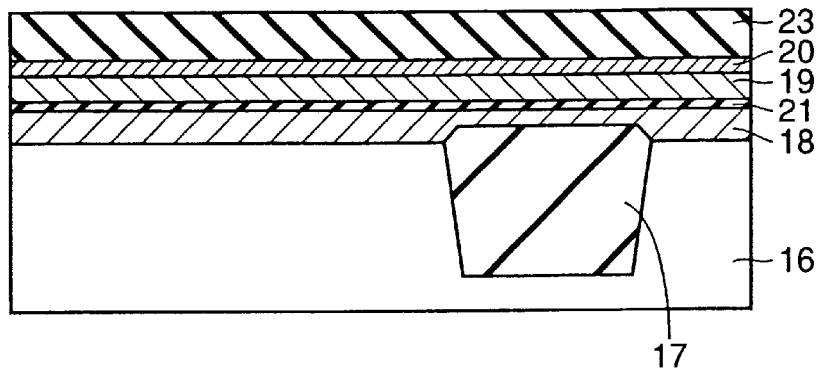

Then, the second polysilicon layer 19 is formed on the insulating layer 21 and the first polysilicon layer 18 as shown in FIGS. 12, 20 and 29 by means of a CVD method or the like. Note that an impurity is preferably doped in the second polysilicon layer 19 for reducing resistance.

A tungsten layer is formed on the second polysilicon layer 19 and a heat treatment is applied in this state to form the tungsten silicide layer 20 on the second polysilicon 19. Then, the insulating layer 23 constituted of a silicon oxide layer or the like is formed on the tungsten silicide layer 20 by means of a CVD method or the like method.

Figure 13:
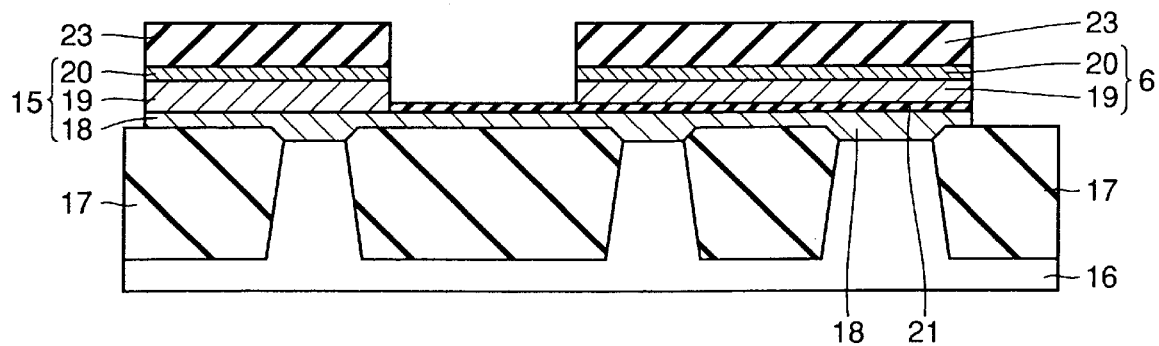
Figure 21:
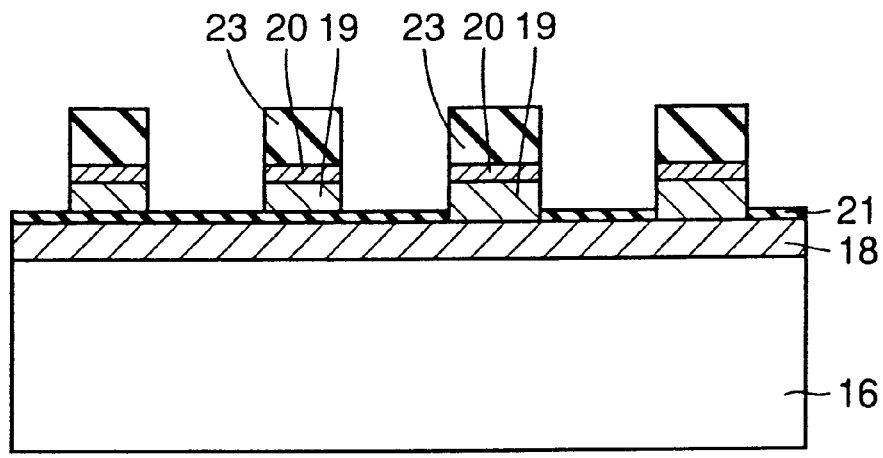
Figure 30:
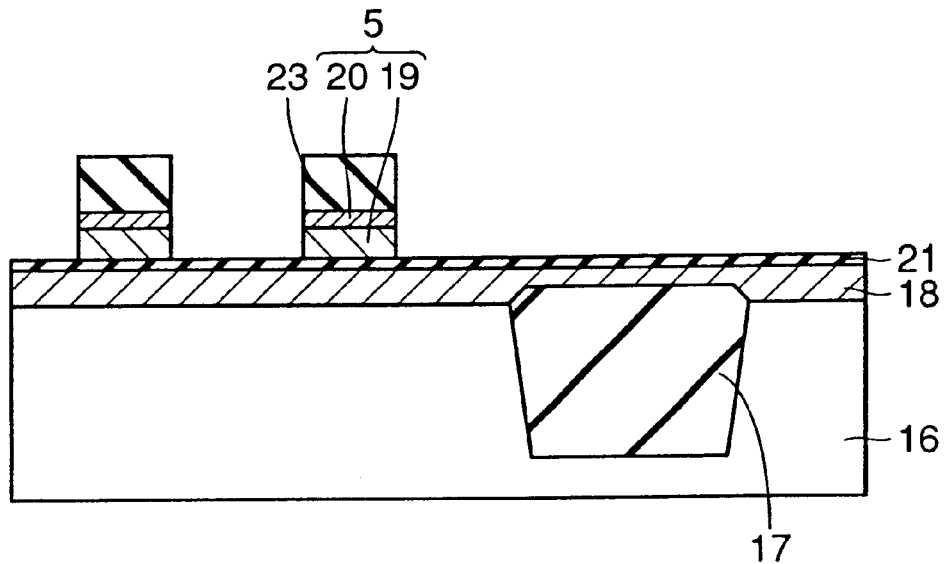

A mask layer (not shown) is formed on the insulating layer 23 and the insulating layer 23 is selectively etched using the mask layer. Thereby, the insulating layer 23 located on the third gate is patterned as shown in FIGS. 13, 21 and 30.

With the insulating layer 23 as a mask, etching is performed on the first and second conductive layers 5 and 6 each of a layered structure composed of the tungsten silicide layer 20 and the second polysilicon layer 19 and the etching is stopped by the insulating film 21.

Figure 14:
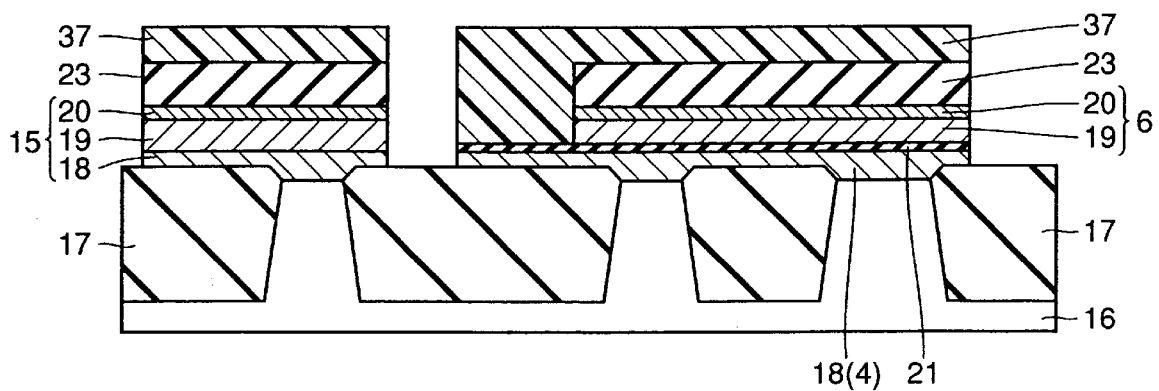
Figure 22:
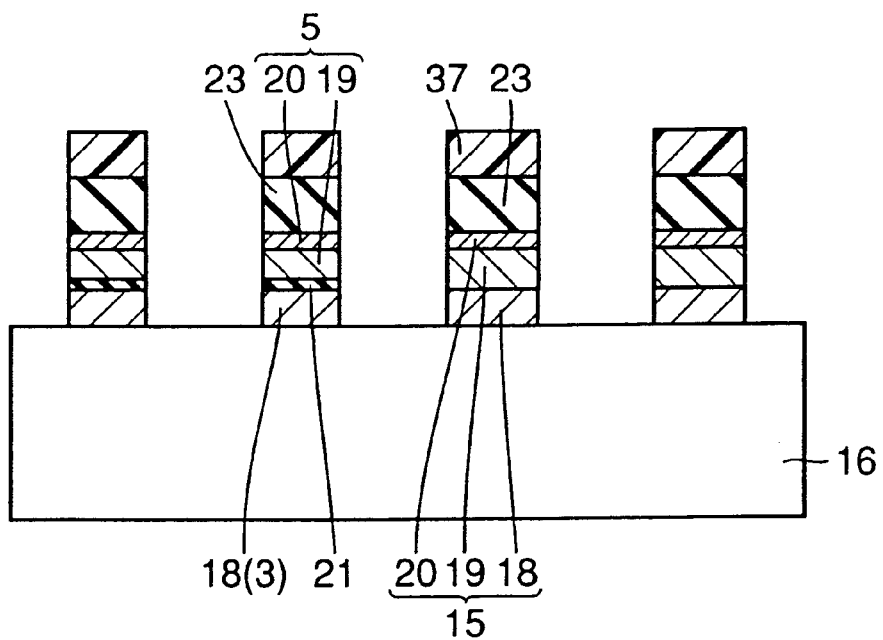
Figure 31:
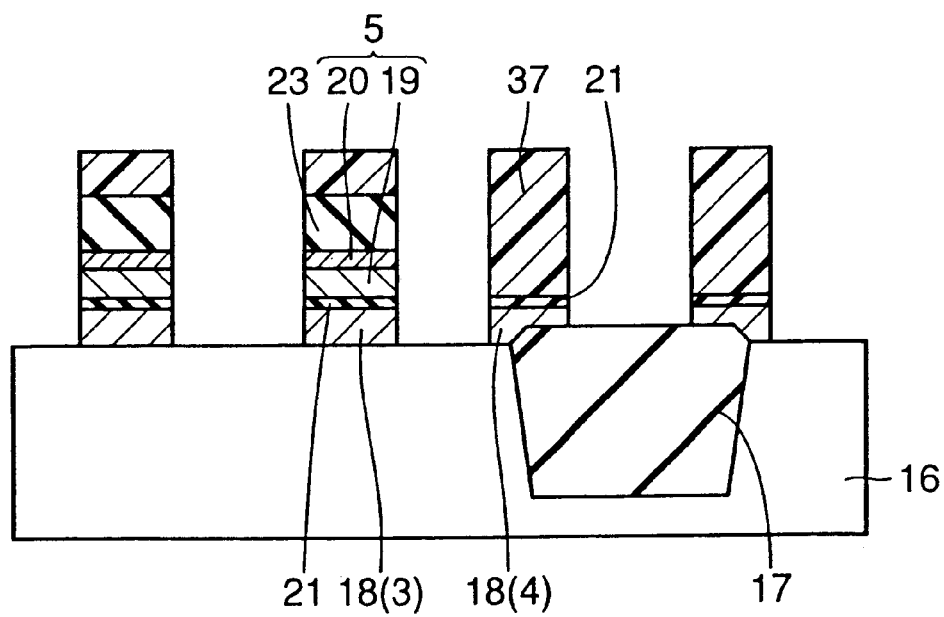

Then, as shown in FIGS. 14, 22 and 31, a mask layer 37 is formed so as to cover the insulating layer 23 and the mask layer 37 and the insulating layer 23 are used as a mask to etch the insulating layer 21 and the first polysilicon layer 18. By doing so, there are formed the first and second gates 3 and 4, and the third gates (the gates of the access MOS transistors Q5 and Q6) 14 and 15.

At this time, since the mask layer 37 extends onto the insulating layer 21 not covered by the insulating layer 23, there can be formed, on the first and second gate 3 and 4, the first and second portions extending from under the polysilicon layer 19 to the first and second access MOS transistors Q5 and Q6 and on which none of the second polysilicon layer 19 exists.

Furthermore, the capacitors can be simultaneously formed on the first and second gates 3 and 4 and a desired capacitance can be added to the storage node.

Moreover, by forming the capacitors on the first and second gates 3 and 4, the first and second conductive layers 5 and 6, the insulating layer 21 and the first and second gates can be patterned using a common mask (the insulating layer 23). With such a procedure, a prescribed overlapping area of the layers can be ensured, whereby a variation in capacitance added to the storage node can be reduced.

Figure 15:
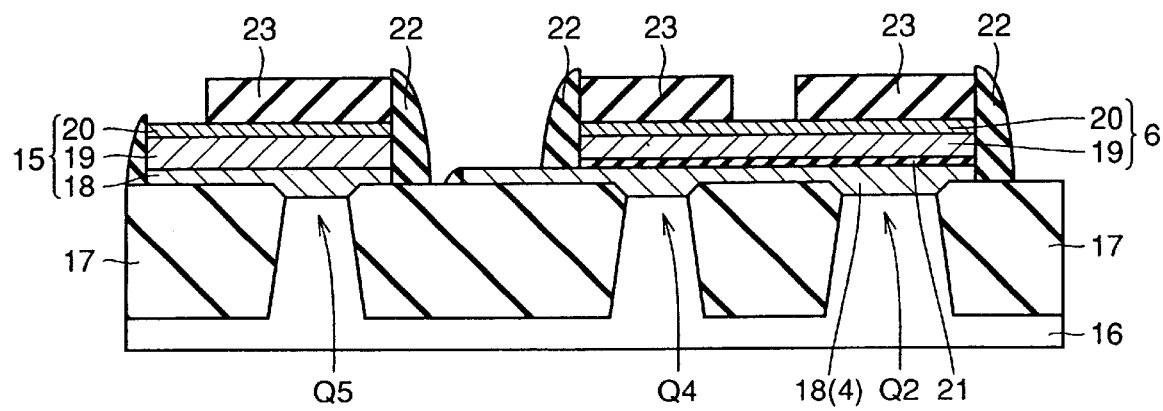
Figure 23:
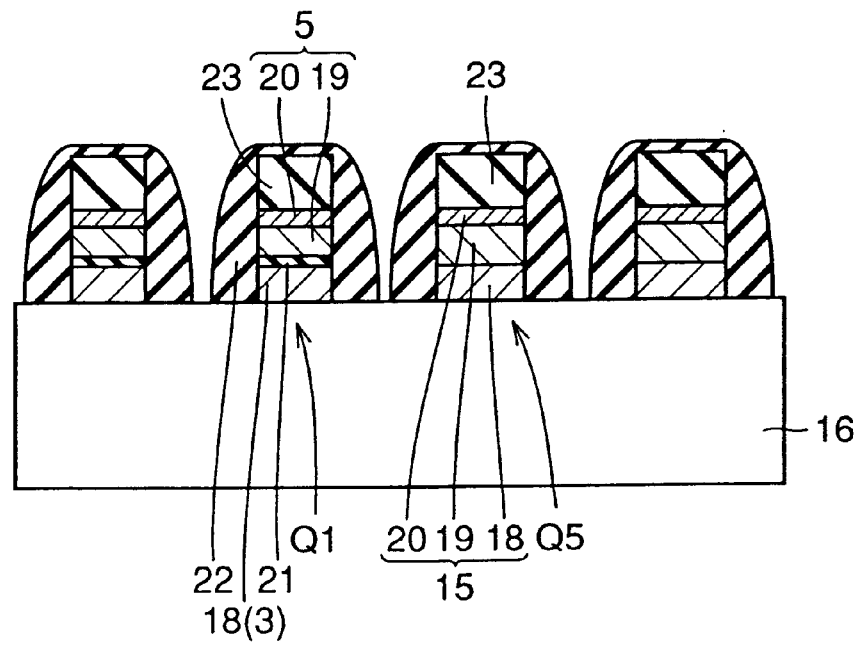
Figure 32:
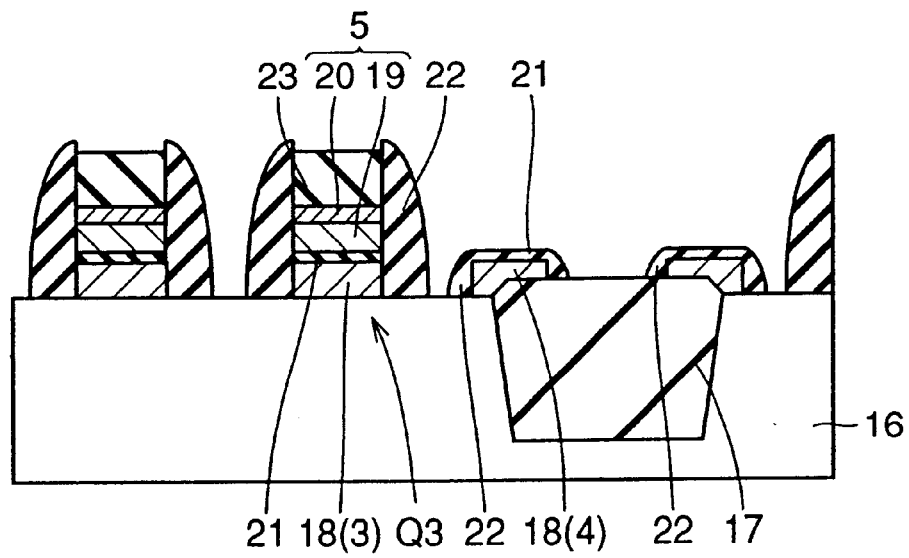

Then, as shown in FIGS. 15, 23 and 32, performed are impurity introduction and formation of a sidewall insulating layer 22 for fabricating a MOS transistor. Herein, as a substance of the sidewall insulating layer 22, adopted is a substance capable of functioning as an etching stopper in etching a silicon oxide layer such as a silicon nitride layer. Thereafter, the insulating layer 23 is selectively etched to form an opening.

Then, an etching stopper layer such as a silicon nitride layer or the like are deposited over all the surface and an interlayer insulating layer 24 such as made from silicon oxide is deposited on the etching layer. After planarizing the interlayer insulating layer 24, a local interconnect forming mask (not shown) is formed on the interlayer insulating layer 24 and the interlayer insulating layer 24 is selectively etched using this mask.

Figure 16:
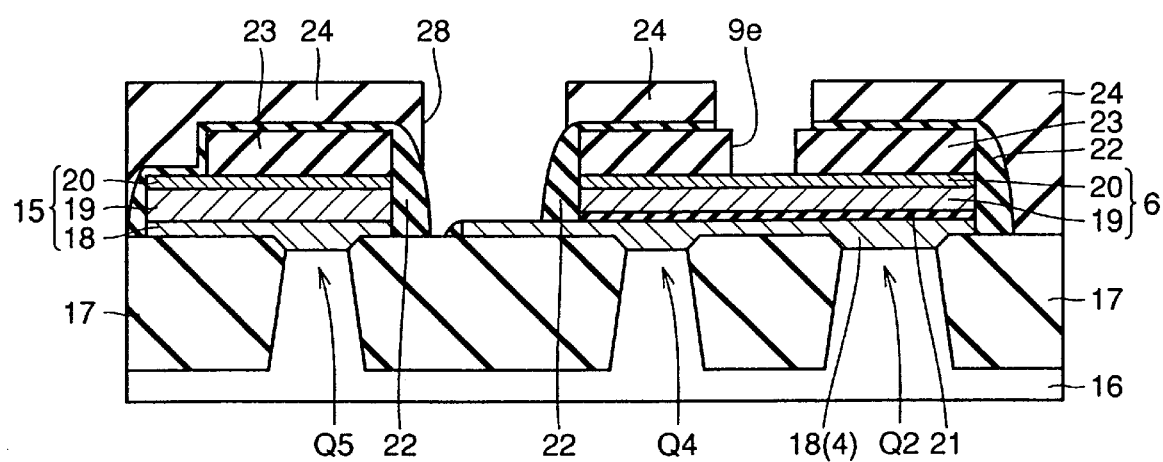
Figure 24:
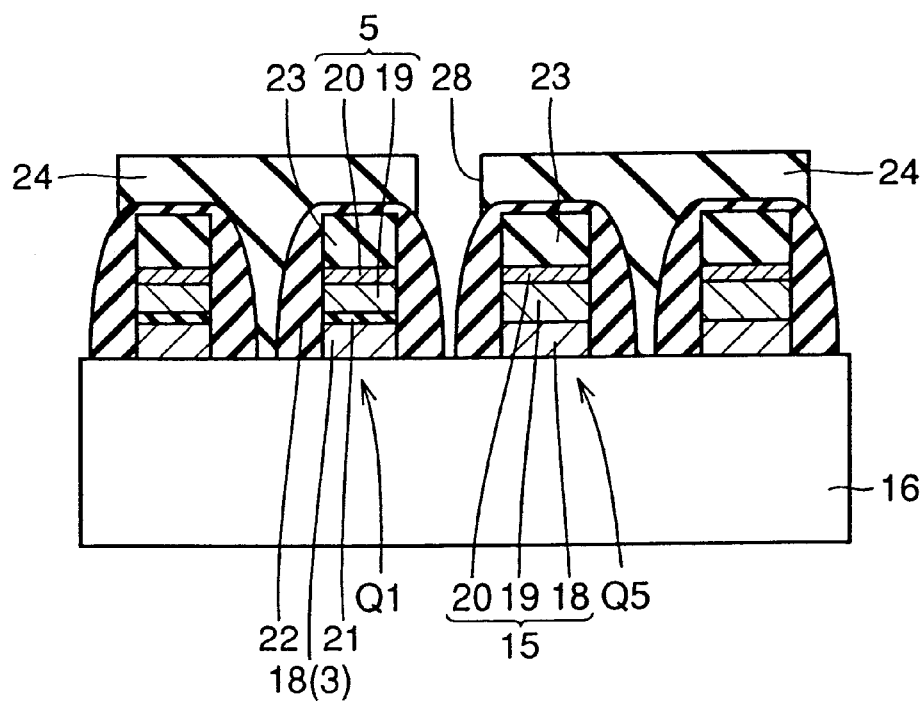
Figure 33:
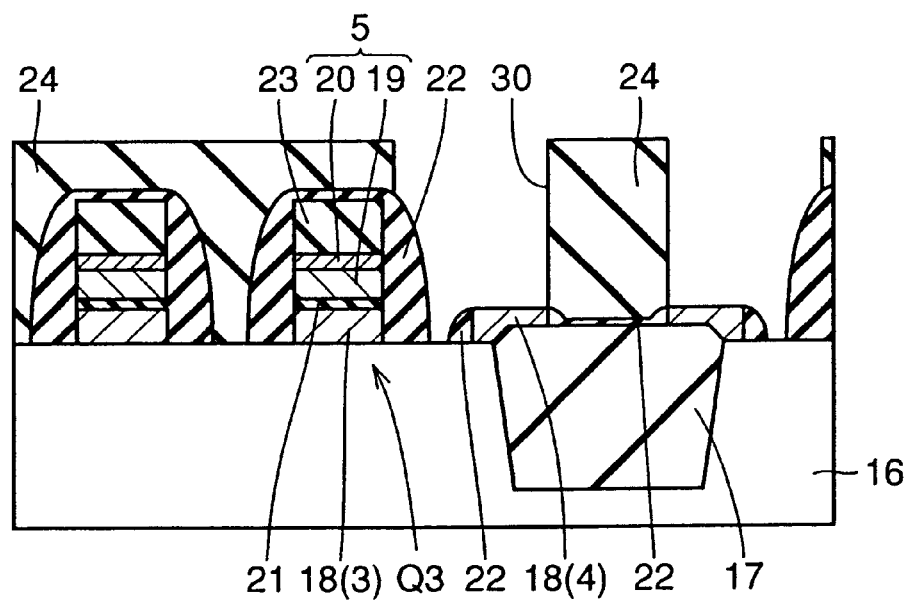

Then, etching is stopped by the etching stopper layer and the etching stopper layer corresponding to the etched-off portions of the interlayer insulating layer 24 is removed. By doing so, the contact holes 9d, 9e, 28 and 30 of a self-aligned structure are formed as shown in FIGS. 16, 24 and 33.

Then, a tungsten layer is deposited so as to cover the interlayer insulating layer 24 by a CVD method or the like method and a surface of the tungsten layer is planarized. With such a procedure, a tungsten layer can be filled in the contact holes 9d, 9e, 28 and 30 and the first and second local interconnects 7 and 8 can be formed as shown in FIGS. 17, 25 and 34.

Thereafter, the interlayer insulating layer 25 constituted of a silicon oxide layer and others is deposited on the interlayer insulating layer 24, followed by planarization of the interlayer insulating layer 25. A mask layer (not shown) is formed on the interlayer insulating layer 25 and the interlayer insulating layers 24 and 25 are selectively etched using the mask layer and the etching stopper layer and the insulating layer 23 are also selectively etched off on the third gates 14 and 15.

Figure 17:
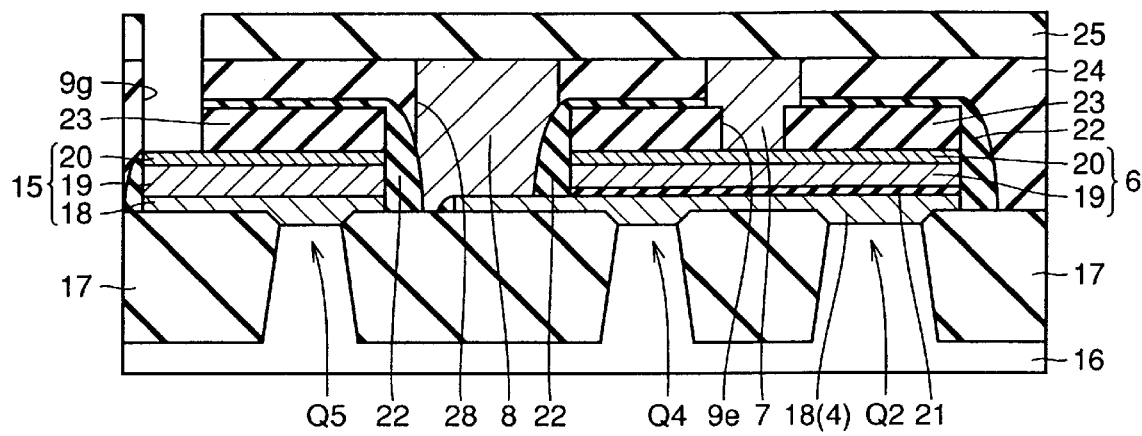
Figure 25:
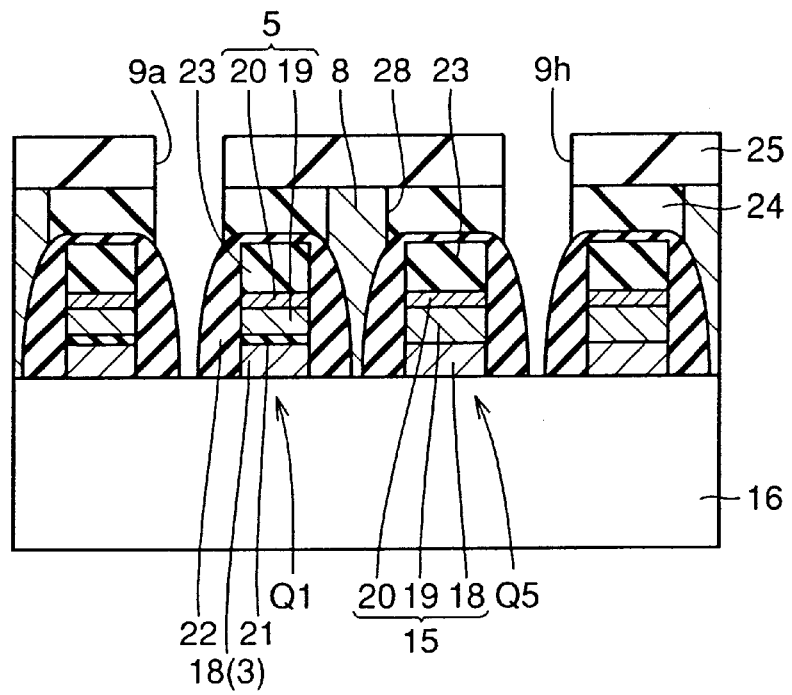
Figure 34:
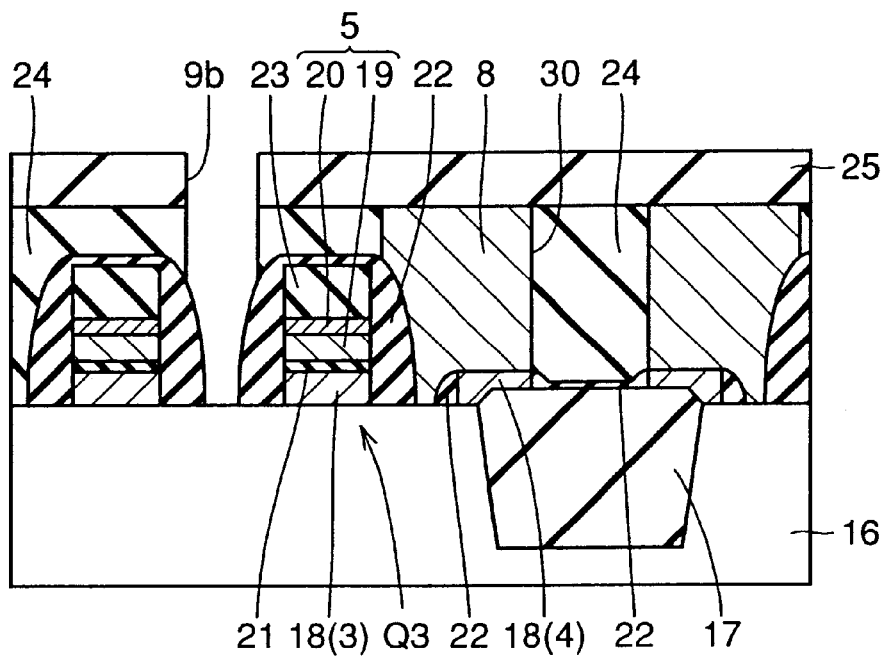

Thereby, as shown in FIGS. 17, 25 and 34, formed are the contact holes of a self-aligned structure 9a to 9c and 9f to 9j.

Figure 18:
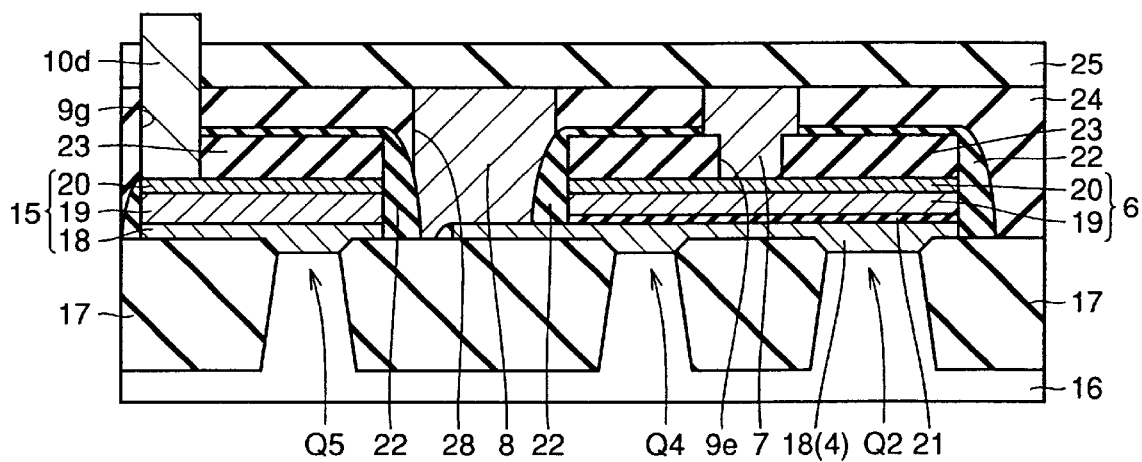
Figure 26:
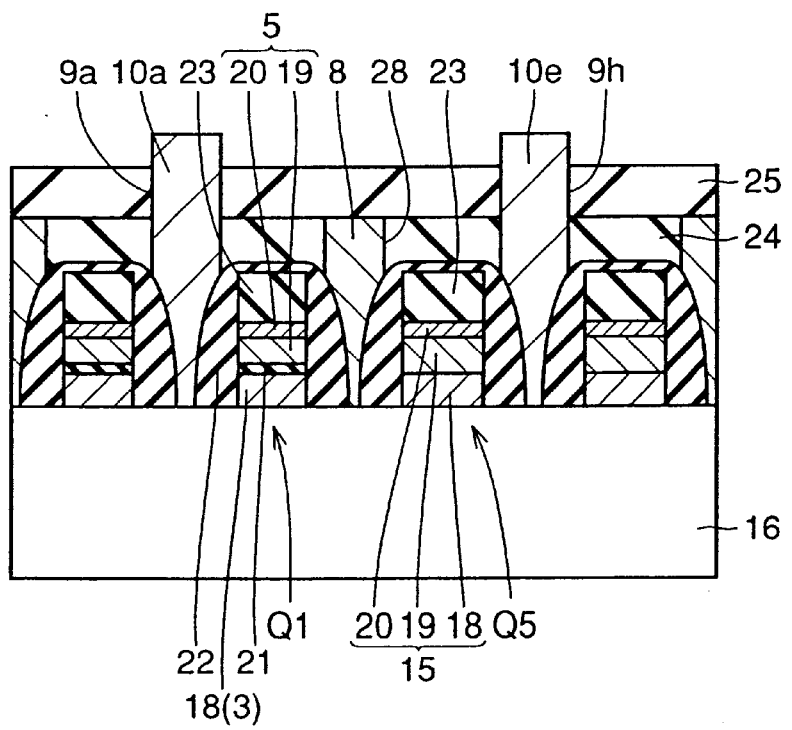
Figure 35:
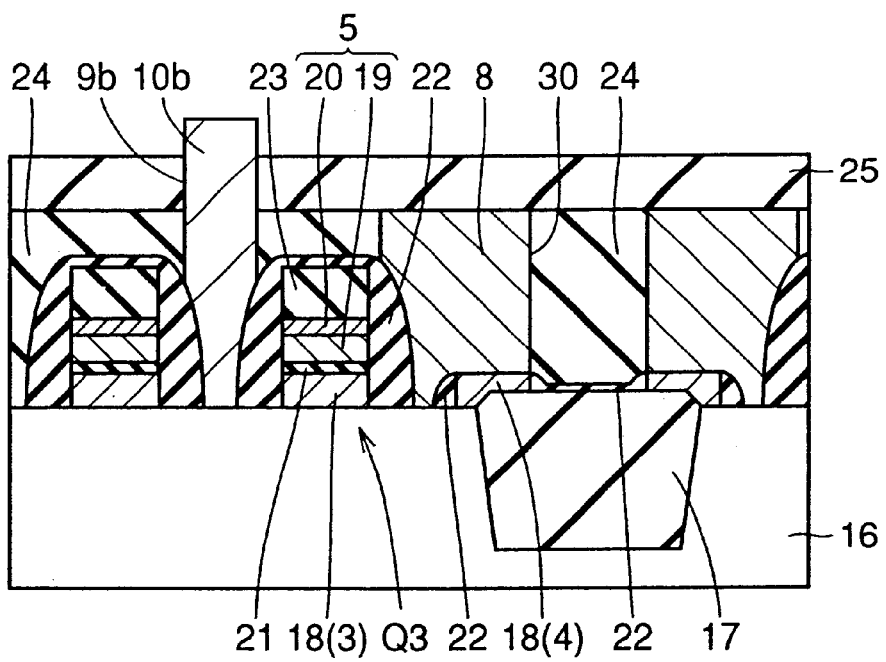

Then, a tungsten layer is deposited so as to cover the interlayer insulating layer 25 by means of a CVD method or the like method and the tungsten layer is patterned. Thereby, not only is a tungsten layer filled in the contact holes 9a to 9c and 9f to 9j, but the metal interconnects 10a to 10g can also be formed on the interlayer insulating layer 25 as shown in FIGS. 18, 26 and 35.

Thereafter, an interlayer insulating layer 26 is formed so as to cover the first metal interconnects 10a to 10g, via holes 12a to 12f are formed in the interlayer insulating layer 26 and a tungsten layer is filled in the via holes 12a to 12f Then, a metal layer is formed on the interlayer insulating layer 26 to pattern the metal layer. Thereby, the second metal interconnects 11a to 11e are formed.

The SRAM memory cell shown in FIGS. 4 to 6 is fabricated through the above described process steps. Thereafter, an interlayer insulating layer not shown is further formed on the second metal interconnects 11a to 11e to form the third metal interconnects on the interlayer insulating layer.

According to the present invention, since prescribed overlapping areas for adding a capacitance to the storage node can be ensured between the following layers and gates: between the first conductive layer, the first insulating layer, the first gate; and between the second conductive layer, the second insulating layer and the second gate, therefore the minimum capacitance added to the storage node can be ensured. Thereby, a variation in capacitance added to the storage node can be reduced compared with a prior art practice and a desired capacitance can be sure to be added to the storage node. As a result, soft error resistance can be improved with sureness.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including: memory cells each having first and second access MOS (Metal Oxide Semiconductor) transistors, first and second driver MOS transistors, and first and second load MOS transistors;
    a first gate forming a gate of said first driver MOS transistor and a gate of said first load transistor;
    a first conductive layer, formed on said first gate with a first insulating layer interposing therebetween, and forming a capacitance between said first gate and said first conductive layer;
    a second gate forming a gate of said second driver MOS transistor and a gate of said second load MOS transistor;
    a second conductive layer, formed on said second gate with a second insulating layer interposing therebetween, and forming a capacitance between said second gate and said second conductive layer;
    a first local interconnect connecting said first gate and said second conductive layer therebetween; and
    a second local interconnect connecting said second gate and said first conductive layer therebetween, wherein said first gate has a first portion on which said first conductive layer is not formed and said first portion extends onto a drain of said second load MOS transistor;
    said second gate has a second portion on which said second conductive layer is not formed and said second portion extends onto a drain of said first load MOS transistor;
    said first local interconnect is electrically connected to said first portion and said second conductive layer through a first contact hole reaching said first portion and said second conductive layer; and
    said second local interconnect is electrically connected to said second portion and said first conductive layer through a second contact hole reaching said second portion and said first conductive layer.

2. The semiconductor memory device according to claim 1, including: word lines; and
    a first well region of a first conductivity type, a second well region of a second conductivity type and a third well region of said first conductivity type, these regions being arranged in each memory cell in an extending direction of said word lines,
    wherein said first access MOS transistor and said first driver MOS transistor are formed in said first well region, said first and second load MOS transistors are formed in said second well region and said second access MOS transistor and said second driver MOS transistor are formed in said third well region.

3. The semiconductor memory device according to claim 1, wherein said first and second gates and said first and second conductive layers each include a polysilicon layer and said first and second insulating layers are each formed between polysilicon layers.

4. The semiconductor memory device according to claim 3, wherein said first and second conductive layers include a polysilicon layer and a silicide layer formed on said polysilicon layer.

5. The semiconductor memory device according to claim 1, wherein said first and second gates each are of a structure including a polysilicon layer and
    said first and second conductive layers each are of a structure including metal layer.

6. The semiconductor memory device according to claim 1, wherein said first and second access MOS transistors have respective gates formed by directly stacking an upper conductive layer corresponding to said first and second conductive layer on a lower conductive layer corresponding to said first and second gate.

7. The semiconductor memory device according to claim 6, including: a memory cell region in which said memory cells are formed; and
    a peripheral circuit region in which a peripheral circuit controlling operations of memory cells is formed,
    wherein said peripheral circuit region includes MOS transistors and gates of said MOS transistors in said peripheral circuit region each have the same structure as each of said first and second access MOS transistors.

8. The semiconductor memory device according to claim 1, wherein said first contact hole reaches said second conductive layer locating between said second driver MOS transistor and said second load MOS transistor and said second contact hole reaches said first conductive layer locating between said first driver MOS transistor and said first load MOS transistor.

9. The semiconductor memory device according to claim 1, formed on a semiconductor layer formed on a substrate with an insulating layer interposing therebetween.

\* \* \* \* \*